United States Patent
Lu et al.

(10) Patent No.: US 10,622,123 B1
(45) Date of Patent: Apr. 14, 2020

(54) FOUR-TERMINAL RESISTOR

(71) Applicant: VIKING TECH CORPORATION, Hsinchu County (TW)

(72) Inventors: Chi-Yu Lu, Hsinchu County (TW); Cheng-Chung Chiu, Hsinchu County (TW)

(73) Assignee: VIKING TECH CORPORATION, Hukou Township, Hsinchu County (TW)

( * ) Notice: Subject to any disclaimer, the term of this patent is extended or adjusted under 35 U.S.C. 154(b) by 0 days.

(21) Appl. No.: 16/557,438

(22) Filed: Aug. 30, 2019

(30) Foreign Application Priority Data

Apr. 2, 2019 (TW) .............................. 108111668 A

(51) Int. Cl.
*H01C 1/14* (2006.01)
*G01R 19/00* (2006.01)
*G01R 15/00* (2006.01)

(52) U.S. Cl.
CPC .............. *H01C 1/14* (2013.01); *G01R 15/00* (2013.01); *G01R 19/0084* (2013.01)

(58) Field of Classification Search
CPC .............................. H01C 1/14; G01R 19/0084
See application file for complete search history.

(56) References Cited

U.S. PATENT DOCUMENTS

| | | | | |
|---|---|---|---|---|
| 4,079,349 A * | 3/1978 | Dorfeld | .................... | H01C 7/06 29/610.1 |
| 7,911,319 B2 * | 3/2011 | Smith | .................... | H01C 17/28 338/332 |
| 8,525,637 B2 * | 9/2013 | Smith | .................. | H01C 17/232 338/22 R |
| 8,581,687 B2 * | 11/2013 | Belman | .................... | H01C 1/16 29/621.1 |
| 8,878,643 B2 * | 11/2014 | Smith | .................... | G01R 1/203 338/22 R |
| 9,343,208 B2 * | 5/2016 | Tsukada | ................. | H01C 1/148 |

* cited by examiner

*Primary Examiner* — Kyung S Lee
(74) *Attorney, Agent, or Firm* — Muncy, Geissler, Olds & Lowe, P.C.

(57) ABSTRACT

The invention relates to a four-terminal resistor. A resistor layer is made to have a big area and symmetrical shape on a substrate. On the resistor layer, an electrode layer is deposed. The electrode layer has two sub-electrode layers, and each sub-electrode layer has the same shape and is disposed with a space to each other. Each sub-electrode layer comprises two terminals, one is a current terminal and the other is a voltage-testing terminal. Especially, the current terminal and the voltage-testing terminal could be exchanged when connecting to the external circuit to enhance the usage flexibility of the four-terminal resistor.

6 Claims, 3 Drawing Sheets

FOUR-TERMINAL RESISTOR

BACKGROUND OF THE INVENTION

1. Field of the Invention

The present invention relates to a four-terminal resistor, particularly to a high-power and high-precision four-terminal resistor.

The "circuit substrate" generally includes a printed wiring substrate, a ceramic substrate, a flexible substrate, a multi-layer wiring substrate, an electrode substrate for a liquid crystal display or a plasma display, and the like. It means that the terminology "circuit substrate" should be understood to be any kind of circuit substrate that can carry the four-terminal resistor mentioned herein.

2. Description of the Prior Art

A four-terminal resistor is formed with four terminals and used to detecting the weak voltage. Two terminals of the four-terminal resistor are used to test voltage and the other two to conduct current. The voltage-testing terminals can eliminate or reduce the extraction voltage in detection, which incurs the detection error. Therefore, the four-terminal resistor can precisely detect the current.

The resistance, between the voltage-testing terminal and the current terminal, has a serious influence to cause an unnecessary power consumption and a precision reduction in monitoring. It is necessary to precisely control the current of precision instruments, such as medicine equipment, test device, converter, controller, communication device and so on, so the precision of the four-terminal resistor is more required.

FIG. 1 is a schematic top view of a prior-art four-terminal resistor structure. A substrate 10, a resistor layer 12, an electrode layer 11 are shown but a protective layer is not shown. The layers of the four-terminal resistor are layered from bottom to top. Two terminals of the electrode layer, having larger areas, are current terminals 111, and two terminals having smaller areas are voltage-testing terminals 112. In general, the four terminals are disposed at four corners of the rectangular outline of the substrate 10.

The two voltage voltage-testing terminals 112 extending from the two current terminals 111 can reduce the measurement error with respective to direct measurement on the current terminals. However, the orientation between the voltage-testing terminal 112 and the current terminal 111 causes a usage restriction. In addition, the area of the substrate uncovered by the resistor layer is idle to waste capability of the heat dissipation.

The present invention, a new four-terminal resistor, can improve the capability of the heat dissipation and the measurement precision to be suitable for high-precision instruments. In addition, the geometry symmetrical design can enhance the usage flexibility.

SUMMARY OF THE INVENTION

A four-terminal resistor proposed here increases the power maximum limit compared to the conventional one with the same area.

A four-terminal resistor, including two voltage-testing terminals and two current terminals, are configured to be symmetrical and then can be interchanged.

A four-terminal resistor comprises a substrate, a resistor layer, an electrode layer and a protective layer and is layered from bottom to top. The resistor layer is disposed on an upside surface of the substrate and substantially covers the upside surface of the substrate. The electrode layer comprises two sub-electrode layers having the same shape, and the two sub-electrode layers are disposed on an upside surface of the resistor layer in a symmetric manner and separated by a space. The protective layer is layered on the top, covers the resistor layer but exposes part of the electrode layer. Usually the electrode layer extends along a lateral surface of the substrate to a downside surface of the substrate, where can be used to solder to an external circuit.

Below, embodiments accompanied with the attached drawings are employed to explain the objectives, technical contents, characteristics and accomplishments of the present invention.

DESCRIPTION OF THE PREFERRED EMBODIMENTS

Figure 1:
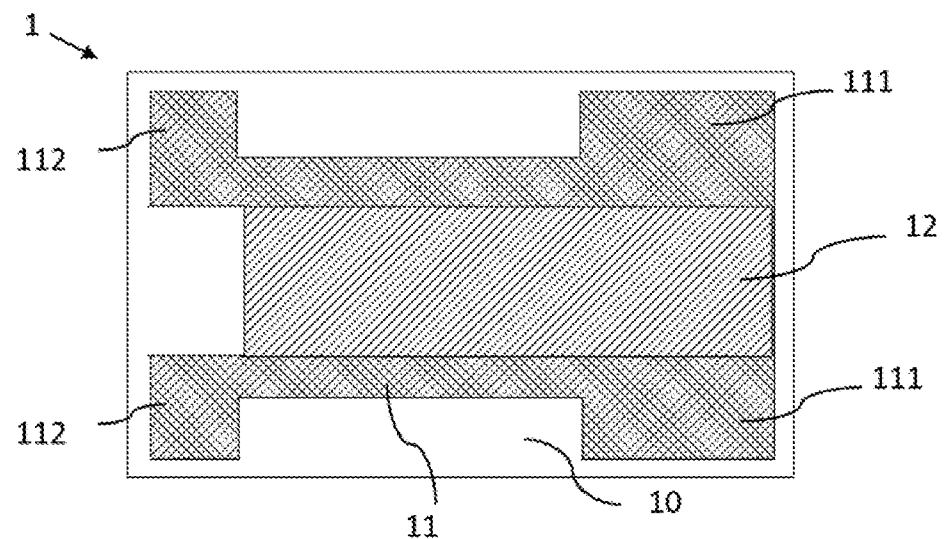
FIG. 1 is a schematic top view of a prior-art four-terminal resistor structure.

Below explain the present invention in detail by some embodiments accompanied with drawings. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily. Similar or identical elements are denoted with similar or identical symbols in the drawings.

One feature of the present invention is that a resistor layer substantially covers an upside surface of a substrate, i.e. the covered area reaches the maximum, so it can push the power maximum up. One electrode layer is composed of two sub-electrode layers, which their shapes are the same substantially. Each of the two sub-electrode layer comprises two same terminals, one serves as a current terminal and the other serves as a voltage-testing terminal. The two sub-electrode layers are symmetrically disposed on the resistor layer and can be interchanged. The resistor enlarge the power capability and enhance flexibility of usage.

Figure 2:
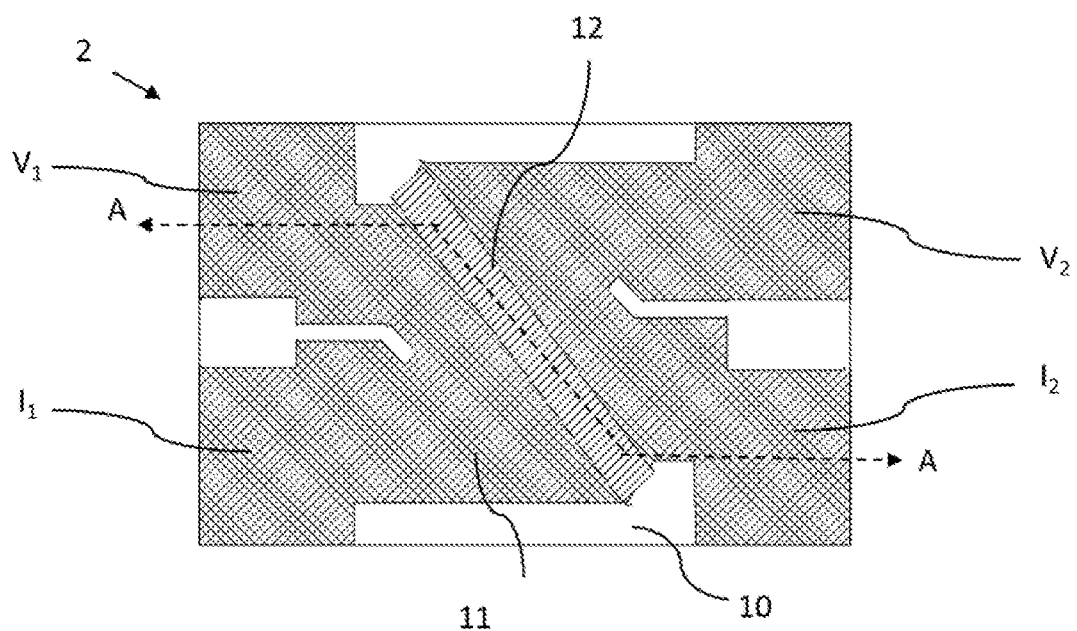
FIG. 2 is a schematic top view of the four-terminal resistor structure of an embodiment of the present invention.

Refer to FIG. 2, which is a schematic top view of the four-terminal resistor structure of an embodiment of the present invention. A four-terminal resistor comprises a substrate 10; a resistor layer 12 disposed on an upside surface of the substrate 10, wherein the resistor layer 12 is symmetrical to its center; an electrode layer 11 disposed on an upside surface of the resistor layer 12, wherein the electrode layer 11 is electrically connected to the resistor layer 12. The electrode layer 11 comprises two sub-electrode layers with same shape, the two sub-electrode layers are disposed symmetrically and separated by a space. Each of the two sub-electrode layer has two same terminals, noted as a first terminal and a second terminal for convenience. The two first terminals and the two second terminals are respectively disposed at four corners of the rectangular substrate 10.

Figure 5:
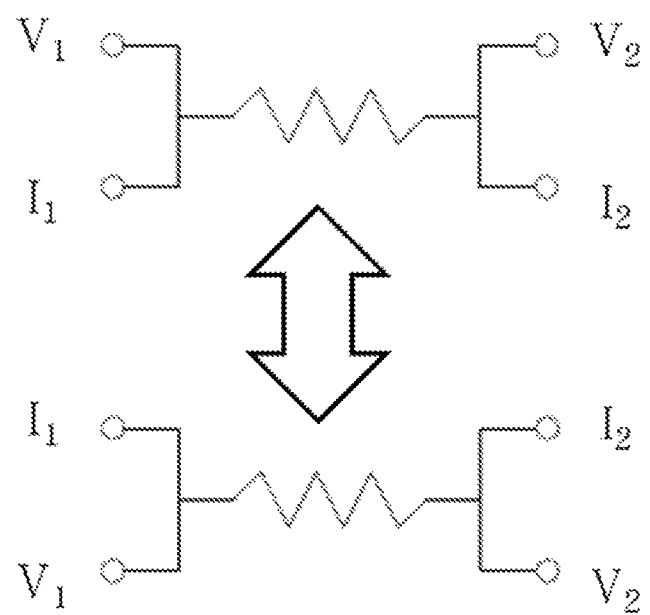
FIG. 5 is an equivalent circuit diagram of the four-terminal resistor of an embodiment of the present invention.

In the embodiment, the two sub-electrode layers are symmetrically arranged, it can be left-right symmetrical, up-down symmetrical manner or other symmetrical. The two first terminals are used as the voltage-testing terminals V1 and V2, the positive (negative) end and the negative (positive) end respectively. The second terminals are the current terminals I1 and I2, the positive (negative) end and the negative (positive) end respectively, corresponding to the voltage-testing terminal V1 and the voltage-testing terminal V2. The resistor layer 12 are symmetrically designed and disposed and the center of the resistor layer 12 as the symmetry center. The first terminal and the second terminal of the resistor layer 12 are the same in shape, so the current terminals I1, I2 and the voltage-testing terminals V1, V2 can be interchanged. FIG. 5 shows a circuit to use the four-terminal resistor, an embodiment of the present invention. The current terminals I1, I2 also be used as the voltage-testing terminals, and the voltage-testing terminals V1, V2 used as the current terminals. The symmetrical design makes the four-terminal resistor convenient to use. Also, although this embodiment mainly adopts a rectangular symmetrical shape only, the shape of the four-terminal resistor can be any symmetrical shapes.

Figure 3:
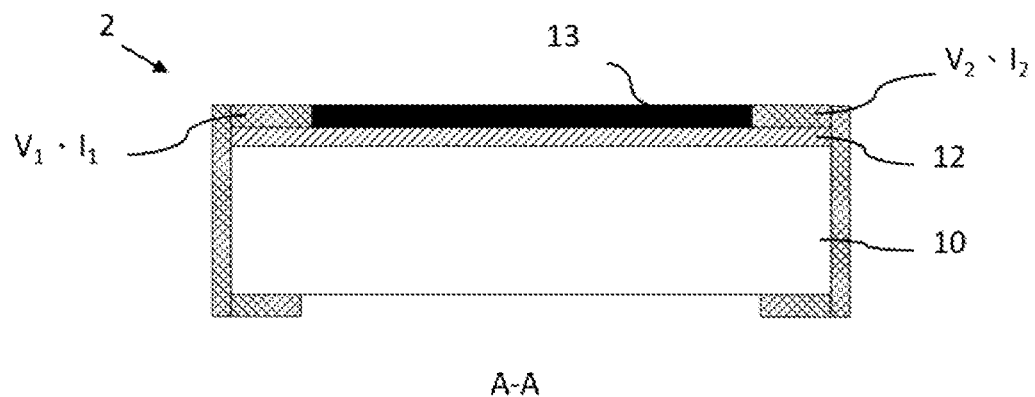
FIG. 3 is a schematic side sectional view of the four-terminal resistor structure of an embodiment of the present invention.

Refer to FIG. 3, which is a schematic side sectional view of the four-terminal resistor of the present invention. The resistor layer 12 is disposed on the upside surface of the substrate 10, and a protective layer 13 covers an area of the upside surface of the resistor layer 12, where the area is the space between the two sub-electrode layer and that is an exposed area of the resistor layer 12. The electrode layer 11 are electrically connected to the resistor layer 12 and extends along the lateral surface of the substrate 10 to the downside surface of the substrate 10, where is configured to connect to an external circuit. Preferably, the resistor layer has a range of thick from 1 μm to 100 μm, and the electrode layer has a range of thick from 1 μm to 100 μm. In particular, up-down and left-right sides described in the manual are easy for explanation, and do not point to a four-terminal resistor to have a fixed orientation or direction.

Figure 4A:
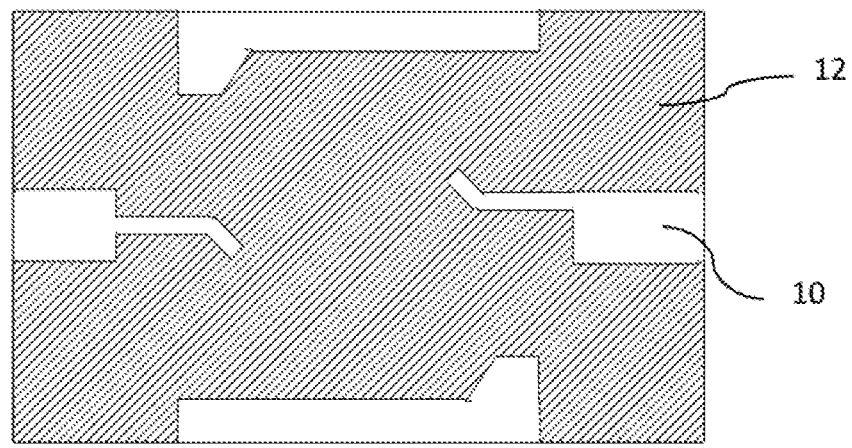
FIG. 4A is a top view of the resistor layer pattern of the four-terminal resistor structure of an embodiment of the present invention.

Refer to FIG. 4A, which a top view of the resistor layer pattern of the four-terminal resistor structure of an embodiment of the present invention. The resistor layer 12 is designed to be symmetrical and the symmetry center is the center of the resistor layer 12. It is emphatically that the symmetry is the feature but the shape and the size can be any. In addition, the resistor layer 12 has a large area of heat dissipation to avoid hot spot effect, i.e. this invention improves properties of the component with large-current and small-resistance tolerance.

Figure 4B:
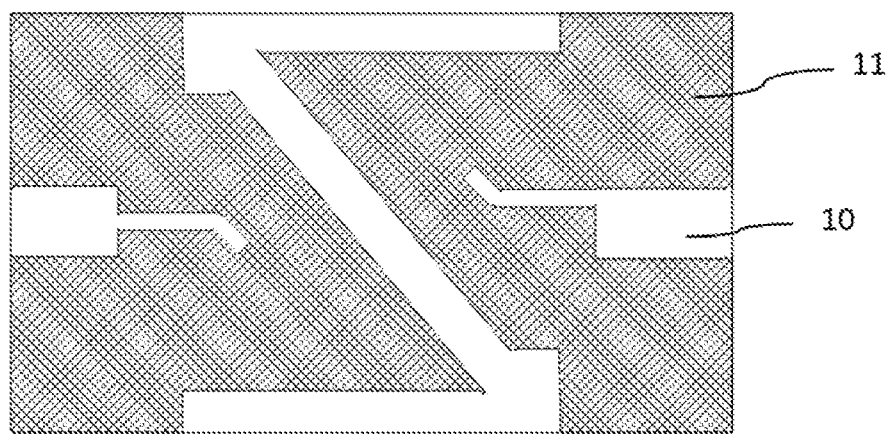
FIG. 4B is a top view of the electrode layer pattern of the four-terminal resistor structure of an embodiment of the present invention.

Refer to FIG. 4B, which is a top view of the resistor layer pattern of the four-terminal resistor structure of an embodiment of the present invention. The electrode layer 11 comprises two sub-electrode layers. The sub-electrode layers are designed to have the same shape, symmetrically disposed and separated by a space. Each of the two sub-electrode layers has a current terminal and a voltage-testing terminal (not shown), so resistance is almost zero between these two terminals. It means that the power consumption is also near zero in measuring. The symmetrical design and arrangement of the two sub-electrode layer allows that the current terminal and the voltage-testing terminal can be interchanged, and the positive end and the negative end also can be interchanged. Comparison with the prior-art electrode layer design, the symmetry between the voltage terminal and the current terminal or the symmetry between the positive end and the negative end takes off the limitation of directivity. Therefore, the symmetrical design of the voltage-testing terminal and the current terminal of the present invention is quite convenient to use.

In the embodiment, the two symmetrical sub-electrode layers of the electrode layer 11 are separated by the space. Usually to adjust the space can control the current error during voltage test or reduce the deformation of waveform of the conductive current.

The four-terminal resistor of the embodiment of the present invention shown in FIG. 2 enlarge the maximum of the power capability, with respective to the prior-art four-terminal resistor shown in FIG. 1, and the comparison of the maximum power is listed in Table 1.

TABLE 1

| Size (inch) | General four-terminal resistor | New four-terminal resistor |
|---|---|---|
| 2010 | ½ W | ¾ W |
| 1206 | ⅓ W | ½ W |

FIG. 5 shows an equivalent circuit diagram of the four-terminal resistor of an embodiment of the present invention. In this embodiment, the position of the voltage-testing terminal V1 and the current terminal I1 and the position of the voltage-testing terminal V2 and the current terminal I2 can be interchanged, and the state between the voltage-testing terminals and the current terminals is near non-resistance state, which can reduce the power consumption derived from the test, as described above.

In this embodiment, the four terminals of the four-terminal resistor of the present invention are all the same, so that the two current terminals I1, I2 and the two voltage-testing terminals V1, V2 can eliminate or reduce the potential error, and percentages of error in different sizes are shown in Table 2.

TABLE 2

| Size (inch) | General four-terminal resistor | New four-terminal resistor |
|---|---|---|
| 2010 | 1% | 0.5% |
| 1206 | 1% | 0.5% |

The embodiments described above are merely illustrative of the technical spirit and features of the present invention, and are intended to enable those skilled in the art to understand the present invention and practice the present invention. The scope of the patent, that is, the equivalent changes or modifications made by the spirit of the present invention, should still be included in the scope of the patent of the present invention.

What is claimed is:

1. A four-terminal resistor comprising:

a substrate;

a resistor layer disposed on an upside surface of the substrate, wherein the resistor layer is symmetrical to a center of the resistor layer;

an electrode layer disposed on an upside surface of the resistor layer and electrically connected to the resistor layer, wherein the electrode layer extends along a lateral surface of the substrate to a downside surface of the substrate, the electrode layer comprises two sub-electrode layers, the two sub-electrode layers are the same and symmetrically disposed and separated by a space, and each of the two sub-electrode layers includes two same terminals, one is defined as a first terminal and the other as a second terminal; and a protective layer disposed on the space between the two the sub-electrode layers to cover the resistor layer.

2. The four-terminal resistor according to claim 1, wherein the resistor layer substantially cover the upside surface of the substrate.

3. The four-terminal resistor according to claim 1, wherein the first terminal is a voltage-testing terminal and the second terminal is a current terminal.

4. The four-terminal resistor according to claim 1, wherein the first terminal is a current terminal and the second terminal is a voltage-testing terminal.

5. The four-terminal resistor according to claim 1, wherein the resistor layer with a range of thick between 1 μm and 100 μm.

6. The four-terminal resistor according to claim 1, wherein the electrode layer with a range of thick between 1 μm and 100 μm.

* * * * *